United States Patent
Kelling et al.

(10) Patent No.: US 7,279,386 B2
(45) Date of Patent: Oct. 9, 2007

(54) METHOD FOR FORMING A SEMICONDUCTOR ARRANGEMENT WITH GATE SIDEWALL SPACERS OF SPECIFIC DIMENSIONS

(75) Inventors: Mark C. Kelling, Marlboro, NY (US); Douglas Bonser, Hopewell Junction, NY (US); Srikanteswara Dakshina-Murthy, Wappingers Falls, NY (US); Asuka Nomura, Poughkeepsie, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 355 days.

(21) Appl. No.: 11/002,586

(22) Filed: Dec. 3, 2004

(65) Prior Publication Data

US 2006/0121711 A1  Jun. 8, 2006

(51) Int. Cl.
*H01L 21/335* (2006.01)
(52) U.S. Cl. .............. 438/286; 438/300; 438/595; 257/E21.024
(58) Field of Classification Search .......... 438/946; 257/E21.024
See application file for complete search history.

(56) References Cited

U.S. PATENT DOCUMENTS

| | | | |
|---|---|---|---|
| 4,033,026 A | 7/1977 | Pashley | |
| 4,962,054 A * | 10/1990 | Shikata | 438/179 |
| 5,656,518 A * | 8/1997 | Gardner et al. | 438/286 |
| 5,930,634 A | 7/1999 | Hause et al. | |
| 6,300,208 B1 | 10/2001 | Talwar et al. | |
| 6,326,270 B1 * | 12/2001 | Lee et al. | 438/279 |
| 6,893,967 B1 | 5/2005 | Wright et al. | |
| 2006/0121711 A1 | 6/2006 | Kelling et al. | |

FOREIGN PATENT DOCUMENTS

WO  PCT/US2005/043397  3/2007

OTHER PUBLICATIONS

Sugihara K. et al: "Parasitic Resistance Reduction in Deep Submicron Dual-Gate Transistors With Partially Elevated Source-Drain Extension Regions Fabricated by Complementary Metal-Oxide-Semiconductor Technologies" Japanese Journal of Applied Physics, Japan Society of Applied Physics. Tokyo, JP, vol. 39, No. 2A, Part 1, Feb. 2000, pp. 387-389, XP001052342, ISSN: D021-4922.

* cited by examiner

*Primary Examiner*—Stephen W. Smoot
(74) *Attorney, Agent, or Firm*—McDermott Will & Emery

(57) ABSTRACT

A method for forming spacers of specific dimensions on a polysilicon gate electrode protects the sidewalls of the polysilicon gate electrode during selective epitaxial growth. The spacers, whether asymmetric or symmetric, are precisely defined by using the same specific exposure tool, such as a 193 nm wavelength step and scan exposure tool, and the same pattern reticle, in both the defining of the polysilicon gate electrode pattern and the pattern spacer, while employing tight alignment specifications.

12 Claims, 4 Drawing Sheets

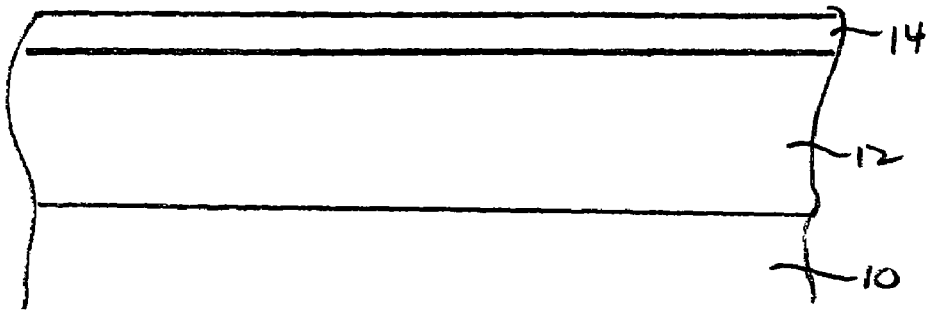
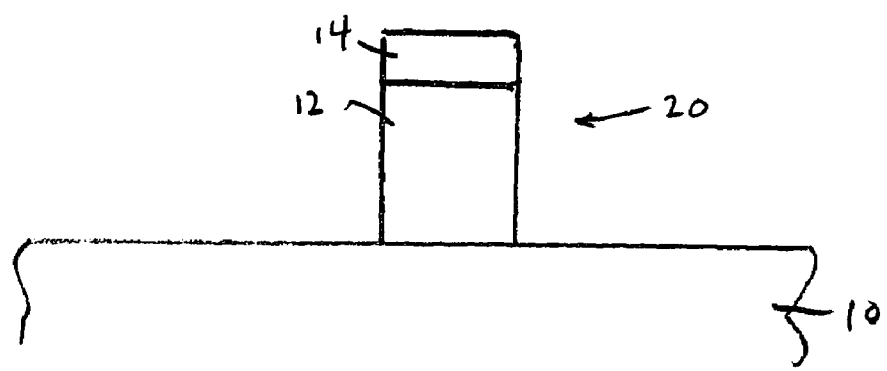
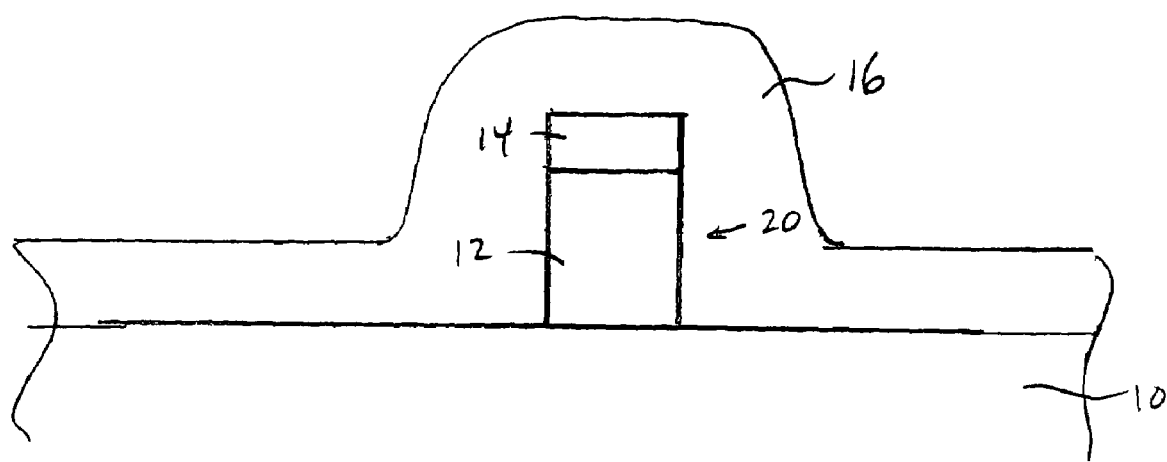

METHOD FOR FORMING A SEMICONDUCTOR ARRANGEMENT WITH GATE SIDEWALL SPACERS OF SPECIFIC DIMENSIONS

FIELD OF THE INVENTION

The present invention relates to a method of manufacturing semiconductor devices, and more particularly, to the formation of spacers of specific dimensions

BACKGROUND OF THE INVENTION

Currently, deep sub-micron complementary metal oxide semiconductor (CMOS) is the primary technology for ultra-large scale integrated (ULSI) devices. Over the last two decades, reducing the size of CMOS transistors and increasing transistors density on integrated circuits (ICs) has been a principle focus of the micro electronics industry.

A ULSI circuit can include CMOS field effect transistors (FETs) which have semiconductor gates disposed between drain and source regions. The drain and source regions are typically heavily doped with a P-type dopant (boron) or an N-type dopant (phosphorous).

The drain and the source regions generally include thin extensions (shallow source and drain extensions) that are disposed partially underneath the gate to enhance transistor performance. Shallow source and drain extensions help to achieve immunity to short-channel effects which degrade transistor performance for both n-channel and p-channel transistors. Short-channel effects can cause threshold voltage roll-off and drain-induced barrier-lowering. Shallow source and drain extensions and, hence, controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as a diffusion process or an ion implantation process. Without the sidewall spacers, the doping process introduces dopants into a thin region just below the top surface of the substrate to form the source and drain extensions as well as to partially form the drain and source regions.

After the drain and source extensions are formed, sidewall spacers, which abut the lateral sides of the gate structure, are provided over the source and drain extensions. With the sidewall spacers in place, the substrate is doped a second time to form deep source and drain regions. During formation of the deep source and drain regions, further doping of the source and drain extensions is inhibited due to the blocking capability of the sidewall spacers.

As the size of transistors disposed on ICs decreases, transistors having shallow and ultra-shallow source/drain extensions become more difficult to manufacture. For example, a transistor may require ultra-shallow source and drain extensions with a junction depth of less than 30 nanometers (nm). Forming source and drain extensions with junctions depths of less than 30 nm is very difficult using conventional fabrication techniques. Conventional ion implantation techniques, for example, have difficulty maintaining shallow source and drain extensions because point defects generated in the bulk semiconductor substrate during ion implantation can cause the dopant to more easily diffuse (transient enhanced diffusion, TED). The diffusion often extends the source and drain extensions vertically downward into the bulk semiconductor substrate. Also, conventional ion implantation and diffusion dopant techniques make transistors on the IC susceptible to short-channel effects, which result in a dopant profile tail distribution that extends deep into the substrate.

To overcome some of these concerns, the source and drain regions can be raised by selective silicon epitaxial growth (SEG) to make connections to source and drain contacts less difficult. The raised source and drain regions provide additional material for contact silicidation processes and reduce deep source/drain junction resistance and source/drain series resistance.

One of the considerations in creating raised source and drains is the separation distance provided between the raised source and drains and the polysilicon gate. Another concern is the protection of the sidewalls of the polysilicon gate during the selective epitaxial growth of silicon. If the polysilicon gate sidewalls are exposed during selective epitaxial growth, unwanted growth will occur at the exposed areas of the polysilicon. It is possible to use a conventional self-aligned to encapsulate the polysilicon and protect it during the selective epitaxial growth of silicon during the creation of the raised source and drains. However, in practice, it is difficult to create the spacers with precise distances and ensure protection of the polysilicon gate sidewalls, since it is difficult to prevent exposure of the polysilicon during the etching process.

SUMMARY OF THE INVENTION

There is a need for a method of creating spacers of specific dimensions that can be used to protect the polysilicon gate sidewalls during selective epitaxial growth of silicon.

This and other needs are met by embodiments of the present invention which provide a method of forming a semiconductor arrangement, comprising the steps of forming a gate electrode having sidewalls, employing an exposure tool to define the gate electrode. Sidewall spacers are formed in the sidewalls of the gate electrode by employing the same exposure tool to define the sidewall spacers.

By employing the same specific exposure tool, such as a step and scan exposure tool, and in certain embodiments the same pattern reticle, that is used to define the polysilicon gate electrode, a pattern spacer may be formed with very tight alignment specifications. The resulting pattern spacer can encapsulate the pattern polysilicon gate structures and protect the sidewalls of the polysilicon gate during selective epitaxial growth to prevent unwanted selective epitaxial growth. The width of the spacer pattern is controlled by the photolithography process parameters, as well as etch process parameters. In certain embodiments of the invention, the spacer pattern may be purposefully aligned with an offset to create asymmetric spacers, allowing for enhanced device performance that is achievable with asymmetric spacers.

The earlier stated needs are also met by other aspects of the present invention which provide a method of controlling sidewall spacer dimensions during semiconductor manufacturing. This method comprises the steps of forming a gate electrode having sidewalls, and forming sidewall spacers on the sidewalls by: deposing a spacer layer over the gate electrode; forming a patterned resist mask over the spacer layer; and etching a spacer layer in accordance with the patterned resist mask.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 1 is a schematic depiction of a portion of a semiconductor wafer during one phase of manufacturing in accordance with embodiments of the present invention.

FIG. 2 depicts a structure of FIG. 1 following the formation of a gate electrode in accordance with embodiments of the present invention.

FIG. 3 shows the structure of FIG. 2 following the deposition of a spacer layer in accordance with embodiments of the present invention.

DETAILED DESCRIPTION OF THE INVENTION

Figure 4:
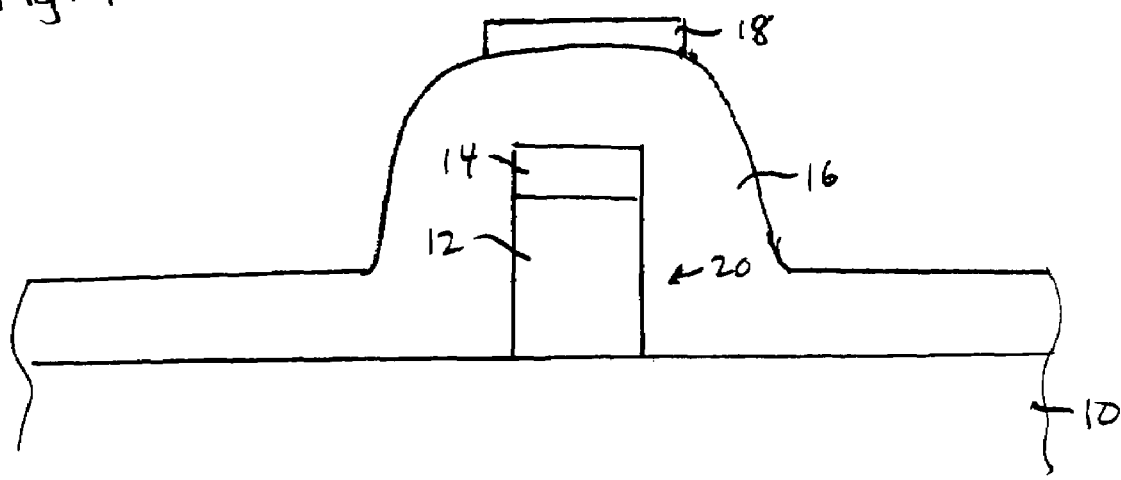
FIG. 4 depicts the structure of FIG. 3 after definition of a resist pattern in accordance with embodiments of the present invention.

The present invention addresses and solves problems related to the protection of polysilicon gate electrodes during a selective epitaxial growth process, and the formation of raised source drains and their separation from the polysilicon gate electrode sidewalls. In particular, the present invention achieves precise spacing of the raised source and drains and ensures protection of the sidewalls of the polysilicon gate electrode by employing the same specific exposure tool used to define the polysilicon gate pattern to define the patterned spacer with very tight alignment specifications. The resulting patterned spacer encapsulates the patterned polysilicon gate electrode structures and protects the polysilicon gate sidewalls during selective epitaxial growth. This prevents unwanted selective epitaxial growth of silicon at the gate electrode. Also, the width of the spacer pattern is precisely controlled by the photolithography process parameters and the etch process parameters. In certain embodiments, the spacer pattern is purposefully aligned with an offset to create asymmetric spacers, allowing for enhancement of device performance through the implantation process.

FIG. 1 schematically depicts a portion of a semiconductor device, in cross-section, formed in accordance with embodiments of the present invention. A substrate 10 is provided that may be any suitable substrate, but in an exemplary embodiment, is a silicon substrate. The gate layer 12 is formed by a conventional deposition technique on the substrate 10. A gate layer 12 may be made of polysilicon, for example. The depth of the gate layer 12 should be equal to the preferred depth of the final gate electrode structure that is desired.

A cap layer 14 is formed on the gate layer 12 and maybe any suitable depth to provide protection to the top of the polysilicon gate electrode during certain stages of processing. In certain embodiments, the cap layer 14 is made of silicon nitride, for example.

FIG. 2 depicts the structure of FIG. 1 following an etching process to form a gate electrode 20. The etching process, in the present invention, employs a specific exposure tool to define the polysilicon gate electrode pattern. A conventional exposure tool may be employed, such as that shown in FIG. 9 and briefly described later. As an example, a conventional 193 nm wavelength step and scan exposure tool may be employed, using a specific pattern reticle to form a mask. The mask is then used in the etching of the polysilicon gate electrode.

A spacer layer 16 is deposited, as is depicted in FIG. 3. A conventional blanket deposition process, such as chemical vapor deposition (CVD) or other suitable methodology, may be employed to form the spacer layer 16. Conventional spacer materials, such as silicon oxide or silicon nitride, or other suitable material, forms the spacer layer 16.

Figure 9:
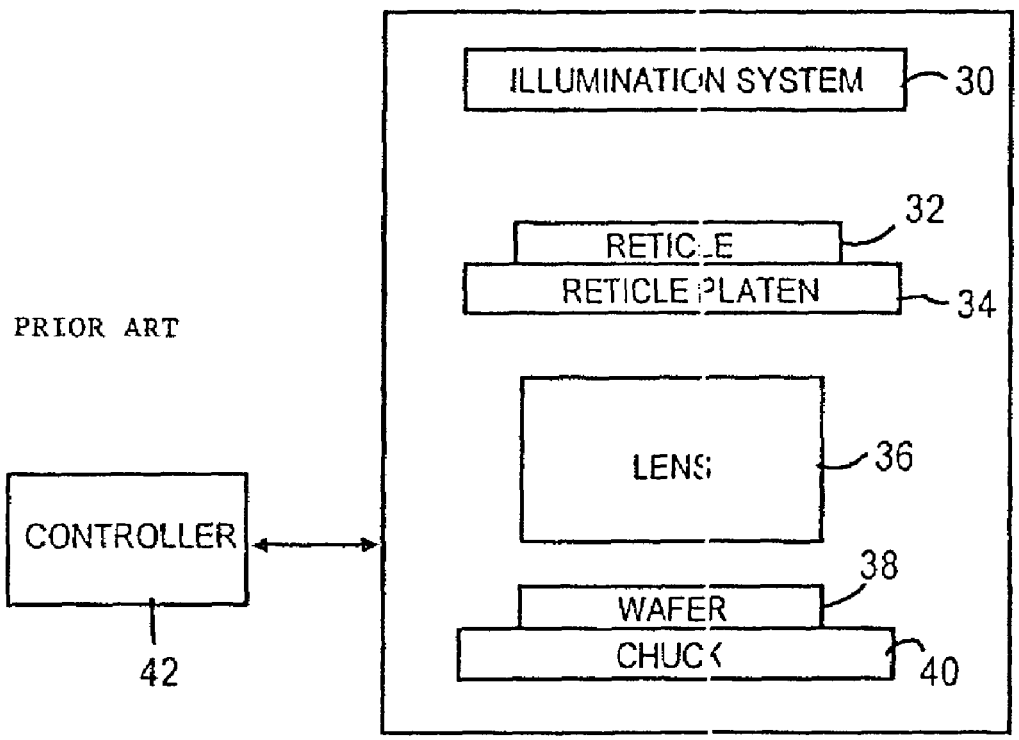
FIG. 9 is a schematic depiction of a side view of a conventional exposure tool that can be used to perform the methods of the present invention.

Following the deposition of spacer layer 16, the spacers are then defined and patterned. In the embodiments of the present invention, the semiconductor wafer is provided in the same, specific exposure tool as employed to form the polysilicon gate electrode. Furthermore, the same pattern reticle that was used to define the polysilicon gate electrode pattern is now used to define the patterned spacer. Hence, the same specific exposure tool, such as that used in FIG. 9, is also used to form a photoresist mask 18 over the polysilicon gate electrode 20, as depicted in FIG. 4. This approach takes advantage of advances in exposure tool lens performance and overlay registration (alignment) performance, as well as advances in reticle manufacturing tolerances.

Figure 5:
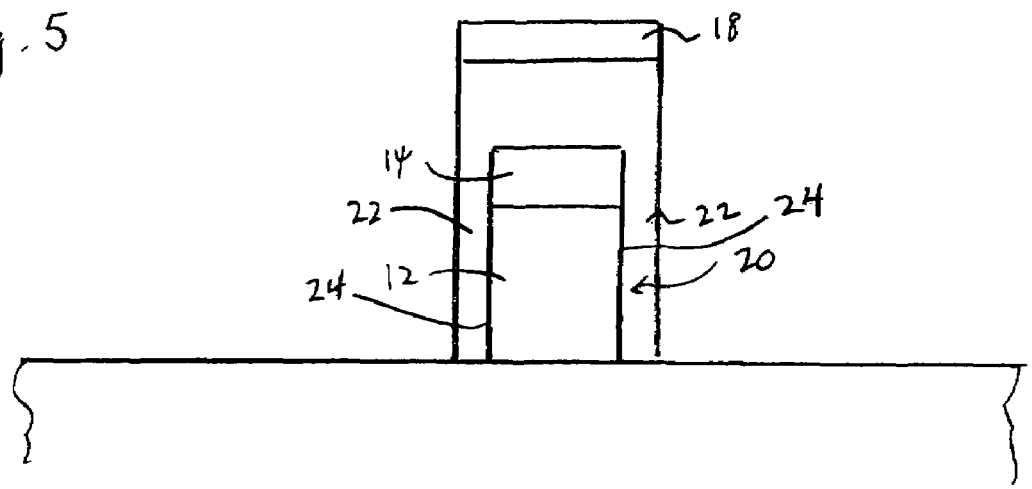
FIG. 5 shows the structure of FIG. 4 following etching of the spacer layer in accordance with embodiments of the present invention.

Following the formation of the photoresist mask 18 over the gate electrode 20, using the same specific exposure tool in forming the mask 18 that was employed to form the gate electrode 20, an etching process is performed in a conventional manner to produce the structure of FIG. 5. Hence, the etching of the spacer layer 16 creates spacers 22 on sidewalls 24 of the gate electrode 20. The spacers 22 have a width W that is very tightly controlled by the photolithography process parameters, such as exposure, reticle to resist C.D. bias, as well as etch process parameters, such as etch chemistry, power, pressure and overetch time.

Figure 6:
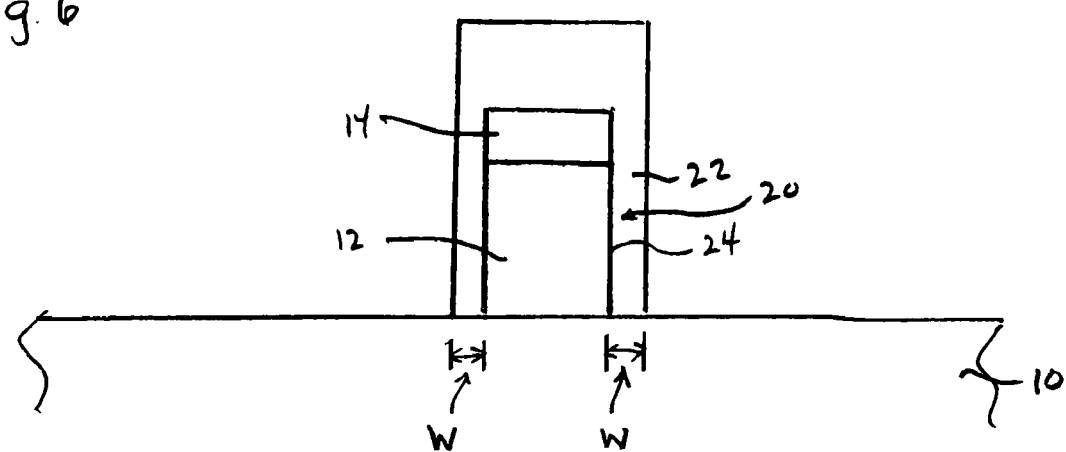
FIG. 6 depicts the structure of FIG. 5 after the resist has been removed in accordance with embodiments of the present invention.
Figure 7:
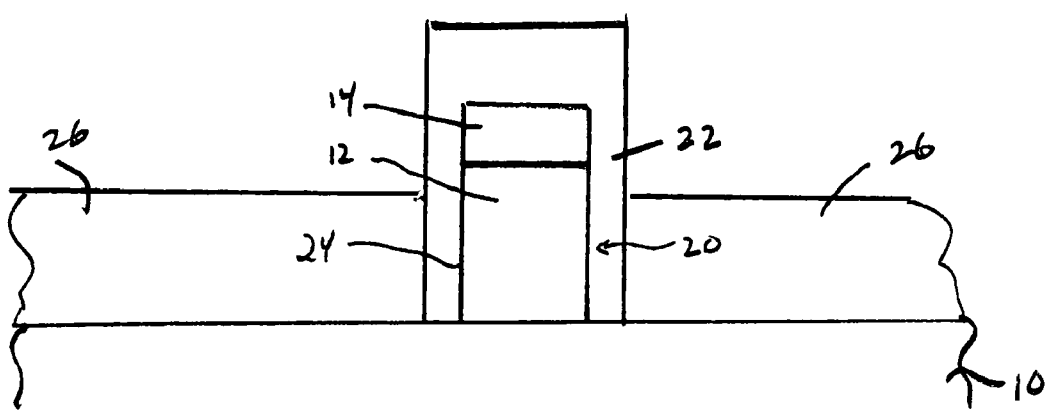
FIG. 7 shows the structure of FIG. 6 following selective epitaxial growth in accordance with embodiments of the present invention.

FIG. 6 shows the structure of FIG. 5 following the removal of the resist 18 by conventional photoresist removal techniques. This leaves the spacers 22 on sidewalls 24 of the polysilicon gate electrode 20 and over the cap layer 14. At a desired point in the process, as depicted in FIG. 7, a selective epitaxial growth process is performed to create regions of selective epitaxial growth 26. These regions are provided at specific distances from the polysilicon gate electrode by the spacers 22 having a precise width W. The entirety of the polysilicon gate electrode 20 is protected from unwanted selective epitaxial growth by the spacers 22 during this process. At this stage, the spacer layer 16 may be etched or removed completely for further processing.

Figure 8:
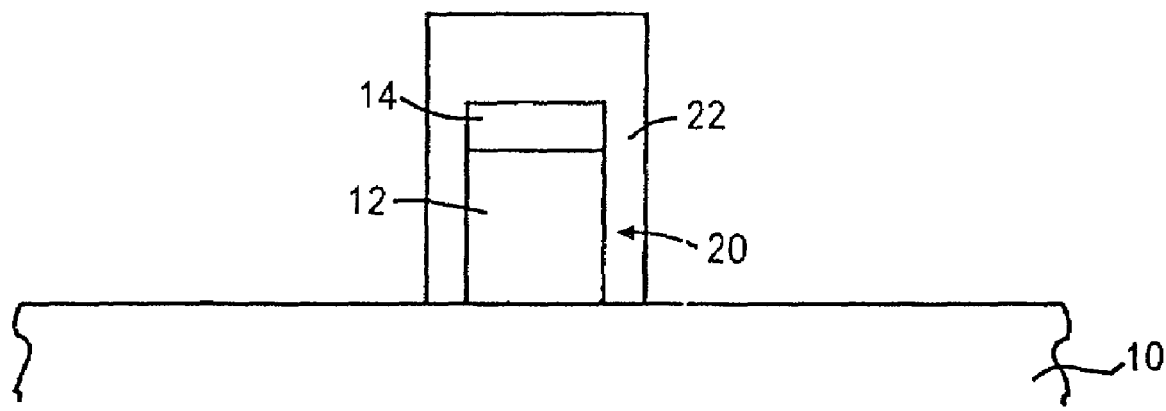
FIG. 8 depicts formation of an asymmetrical spacer arrangement in accordance with embodiments of the present invention.

The illustrated embodiment of the spacers 22 in FIG. 6 and FIG. 7 depicts spacers that have a symmetrical width. However, in certain embodiments of the invention, asymmetric spacers are formed that have different widths. This is depicted in FIG. 8. Asymmetrical widths of spacers provide enhancement to device performance, by allowing asymmetrical doping to achieve improved performance for individual transistors. For example, asymmetrical spacers allow decoupling of the optimum characteristic of an n-channel transistor from a p-channel transistor, as well as decoupling performance of similarly doped n-type transistors or p-type transistors depending upon the function, such as maximizing drive current or optimizing short channel effects.

The asymmetrical spacers are achieved in accordance with embodiments of the present invention by purposefully aligning the spacer pattern with an offset. For example, in the embodiment of the step and scan exposure tool to FIG. 9, an offset value may be placed in the alignment parameters of the exposure tool. Hence, the photoresist 18 will not be aligned in a centered manner over the polysilicon gate electrode 20, but rather in an offset manner by a desired amount. Etching of the spacer layer 16 then produces the structure of FIG. 8. Further processing can proceed as described earlier.

For explanation purposes, an exemplary step and scan exposure tool is depicted schematically in FIG. 9, and includes an illumination system 30 that provides illumination to the arrangement. A pattern reticle 32 is held by a reticle platen 34. As described earlier, the same specific reticle 32 is employed in both the patterning of the polysilicon gate electrode 20 and the spacers 22. A lens arrangement 36 focuses the light from the illumination system 30 onto a semiconductor wafer 38 held by a chuck 40. A controller 42 controls the operation of the step and scan exposure tool.

Hence, with the methodology of the present invention, spacers of precisely controlled specific dimensions, whether asymmetric or symmetric, can be created to protect the polysilicon sidewalls during selective epitaxial silicon growth, thereby preventing unwanted selective epitaxial growth from occurring at the exposed areas of the polysilicon gate electrode.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming a semiconductor arrangement, comprising the steps:
   forming a gate electrode having sidewalls employing: a step and scan exposure tool to define the gate electrode, and a pattern reticle; and
   forming sidewall spacers on the sidewalls of the gate electrode employing: the same exposure tool to define the sidewall spacers, and the same pattern reticle employed in the forming of the gate electrode.

2. The method of claim 1, wherein the forming of the sidewall spacers includes depositing a spacer layer over the gate electrode, and forming a photoresist mask on the spacer defined by the pattern reticle.

3. The method of claim 2, further comprising anisotropically etching the spacer layer to form the sidewall spacers in accordance with the photoresist mask.

4. The method of claim 3, further comprising performing selective epitaxial growth on a substrate on which the gate electrode is formed, the sidewall spacers protecting the sidewalls of the gate electrode from selective epitaxial growth during the performing of the selective epitaxial growth.

5. The method of claim 4, wherein the sidewall spacers on the sidewalls of a gate electrode have symmetric widths.

6. The method of claim 4, wherein the sidewall spacers on the sidewalls of the gate electrode have asymmetric widths.

7. The method of claim 6, further comprising offsetting an alignment of the exposure tool when forming the sidewall spacers.

8. The method of claim 7, wherein the step of offsetting includes adding an offset value to alignment parameters of the exposure tool.

9. A method of controlling sidewall spacer dimensions during semiconductor manufacturing, comprising the steps:
   forming a gate electrode having sidewalls; and
   forming sidewall spacers on the sidewalls by: depositing a spacer layer over the gate electrode; forming a pattern resist mask over the spacer layer, and etching the spacer layer in accordance with the pattern resist mask, wherein the step of forming the gate electrode includes defining the gate electrode with an exposure tool and a pattern reticle, and the step of forming the sidewall spacer includes defining the pattern resist mask using the same exposure tool and pattern reticle.

10. The method of claim 9, wherein the sidewall spacers are symmetrical.

11. The method of claim 9, wherein the sidewall spacers are asymmetrical.

12. The method of claim 11, wherein the step of forming the asymmetrical sidewall spacers includes offsetting an alignment of the exposure tool.

* * * * *